United States Patent
Boon et al.

(10) Patent No.: US 6,455,805 B1
(45) Date of Patent: Sep. 24, 2002

(54) TRAY MASK PLATE FOR LASER-TRIMMING APPARATUS

(75) Inventors: Thomas Wong Han Boon; Simon Cha Ser Min; Ronnie Lee Hock Boon; Koh Hock Chuan, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/764,624

(22) Filed: Jan. 17, 2001

(51) Int. Cl.[7] .............................................. B23K 26/38
(52) U.S. Cl. ................................................ 219/121.67
(58) Field of Search ...................... 219/121.67, 121.68, 219/121.69, 121.7, 121.71, 121.72, 121.85, 121.86

(56) References Cited

U.S. PATENT DOCUMENTS

| | | | |
|---|---|---|---|
| 4,328,410 A | * 5/1982 | Slivinsky et al. | 219/121.69 |
| 5,099,101 A | 3/1992 | Millerick et al. | |
| 5,504,301 A | * 4/1996 | Eveland | 219/121.67 |
| 5,883,357 A | * 3/1999 | Newman et al. | 219/121.67 |
| 6,040,094 A | * 3/2000 | Otsuka et al. | 428/195 |
| 6,043,453 A | * 3/2000 | Arai | 219/121.68 |
| 6,172,330 B1 | * 1/2001 | Yamamoto et al. | 219/121.7 |

FOREIGN PATENT DOCUMENTS

| | | |
|---|---|---|
| JP | 9207313 | 8/1997 |
| JP | 11314189 | 11/1999 |
| JP | 2000288753 | 10/2000 |

* cited by examiner

Primary Examiner—Samuel M. Heinrich
(74) Attorney, Agent, or Firm—LaRiveiere, Grubman & Payne, LLP

(57) ABSTRACT

A stainless steel plate establishes a mask plate for a laser trimming tray. The plate has several openings through which laser light can be directed onto semiconductor chips borne by the tray. The plate is supported on pneumatic pistons which can raise the plate to allow a tray to be disposed underneath, and then the plate is lowered and pressed against the tray, with the weight of the plate flattening and straightening the tray to promote precise laser cuts of the chips on the tray.

17 Claims, 2 Drawing Sheets

TRAY MASK PLATE FOR LASER-TRIMMING APPARATUS

TECHNICAL FIELD

The present invention relates generally to cutting circuit components on a microprocessor chip using laser trimming principles.

BACKGROUND OF THE INVENTION

A laser trimming handler is used to convey what are to become microprocessor chips across the path of a laser, which cuts predetermined circuit components into the chips. Several chips can be loaded onto a tray, with the tray then being placed at an input loading station and conveyed through the laser cutting chamber. The tray is extracted and unloaded at an output station.

It is to be appreciated that as microprocessor chips are made with ever-smaller circuit components, the above-described laser cutting process must make ever-finer cuts. The present invention has made the critical observation that the trays in which the microprocessor chips are borne through the cutting chamber are frequently reused, and that over the course of their lifetime can become bent and warped. The deformation of the trays is not noticeable to the human eye and consequently can remain undetected. Unfortunately, even a minute deformation of a tray can alter the cutting depth of the laser sufficiently to cause improper component formation. Accordingly, the present invention has provided the below-disclosed solutions to one or more of the above-noted problems.

BRIEF SUMMARY OF THE INVENTION

A device for promoting precise laser cuts in a laser trimming apparatus is disclosed. The laser trimming apparatus can include a conveyor system that moves trays into and out of a laser cutting chamber, with each tray holding plural semiconductor devices. The device of the present invention includes a rigid hard plate that preferably is made of steel and that is formed with at least one opening through which laser light can be directed. A lift system is engaged with the plate for moving the plate between a raised position, wherein the plate is distanced from a tray such that the tray can be moved beneath the plate, and a lowered position, wherein the plate contacts the tray to flatten the tray. The preferred plate is located within the cutting chamber.

In a preferred embodiment, at least one bottom edge of the plate is formed with a chamfer for aligning the plate with the tray. More preferably, the bottom edge includes two chamfers and a distance is defined between the chamfers. The distance is marginally larger than a length of an edge of the tray.

In another aspect, a method for undertaking a laser cut of at least one semiconductor device includes disposing the semiconductor device on a tray, and conveying the tray into a cutting chamber of a laser trimming apparatus. The method also includes lowering a plate onto the tray to flatten the tray. The plate defines at least one opening. Accordingly, a laser can be directed through the opening onto the semiconductor device to cut a component into the device. Then, the tray is conveyed out of the cutting chamber.

In still another aspect, an assembly for laser trimming includes a tray configured to hold semiconductor devices, and a laser cutting chamber is also included. A conveyor system conveys the tray into and out of the cutting chamber. A lift system selectively presses a plate against the tray to flatten the tray and thereby facilitate precise cutting.

Other features of the present invention are disclosed or apparent in the section entitled DETAILED DESCRIPTION OF THE INVENTION.

DETAILED DESCRIPTION OF THE INVENTION

Figure 1:
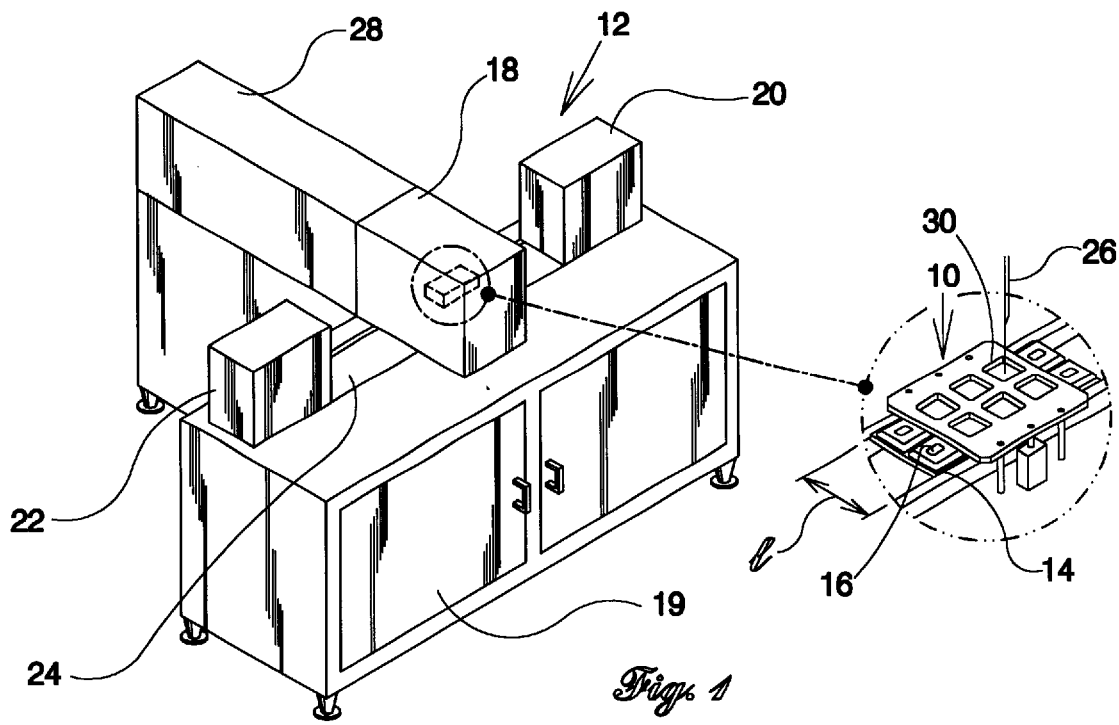
FIG. 1 is a schematic view of the present mask plate in an exploded relationship with a laser trimming apparatus.

Referring initially to FIG. 1, a mask plate is shown, generally designated 10, in operative relationship with a laser trimming apparatus 12 that includes a conveyor system which moves trays 14 holding plural semiconductor devices 16, e.g., microprocessor chips, into and out of a laser cutting chamber 18. As discussed in further detail below, the plate 10 preferably is reciprocatingly mounted inside the cutting station 18.

As shown, one preferred but non-limiting conveyor system includes a handler 19 supporting an input station 20 into which the trays 14 are disposed, an output station 22 from which the trays 14 are extracted, and a conveyor belt 24 running therebetween. A laser beam from a laser system 28 can propagate through one or more rectangular openings 30 in the plate 10 inside the cutting chamber 18 to cut circuit components into the semiconductor devices 16.

Figure 2:
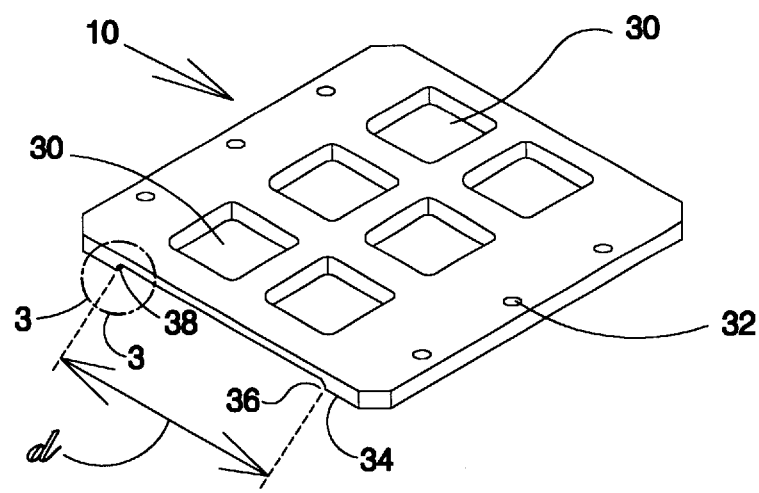
FIG. 2 is a perspective view of the present mask plate.
Figure 3:
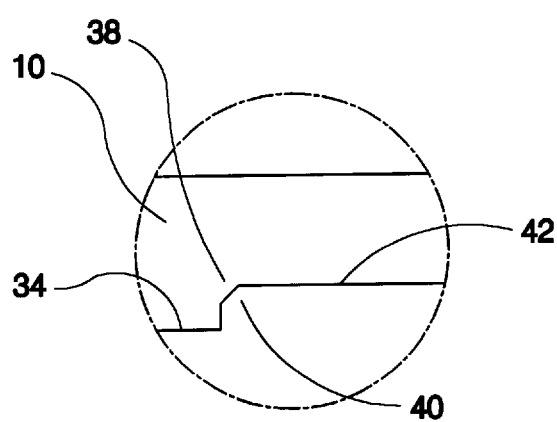
FIG. 3 is a detail of the chamfer as indicated by the circle 3—3 in FIG. 2.

The details of the mask plate 10 can be seen in reference to FIGS. 2 and 3. In the presently preferred embodiment, the plate 10 is made of a rigid hard material, preferably steel.

It is formed with plural openings 30 that are generally rectangular in the embodiment shown but that can be other suitable shapes. Plural lift system holes 32 are formed around the edges of the plate 10 to engage the plate 10 with the lift system described further below.

As envisioned by the present invention, to help align the plate 10 with a tray 14, at least one bottom edge 34 is formed with at least one chamfer 36 and preferably with two chamfers 36, 38. If desired, the edge opposite the bottom edge 34 can also be formed with chamfers. In any case, the distance "d" between the chamfers 36, 38 is approximately equal to (marginally larger than) the length "1" (FIG. 1) of a side of a tray 14 that is juxtaposed with the bottom edge 34. With this cooperation of structure, as the plate 10 is lowered on to the tray 14 as set forth further below, the side of the tray is closely received between the chamfers 36, 38, with the chamfers being configured to guide the plate 10 onto the tray 14 in alignment therewith.

More specifically, as shown best in FIG. 3, the chamfer 38 is somewhat convex, rather than defining a right angle joint between orthogonal surfaces. With this structure, the tray 14 can ride along a chamfer surface 40 of the chamfer 38 until its mates flush with a receiving portion 42 of the bottom edge 34. It will be appreciated that the length of the receiving portion 42 is equal to the length "1" of the side of the tray 14. It is to be understood that the chamfer 36 is configured identically to the chamfer 38.

Figure 4:
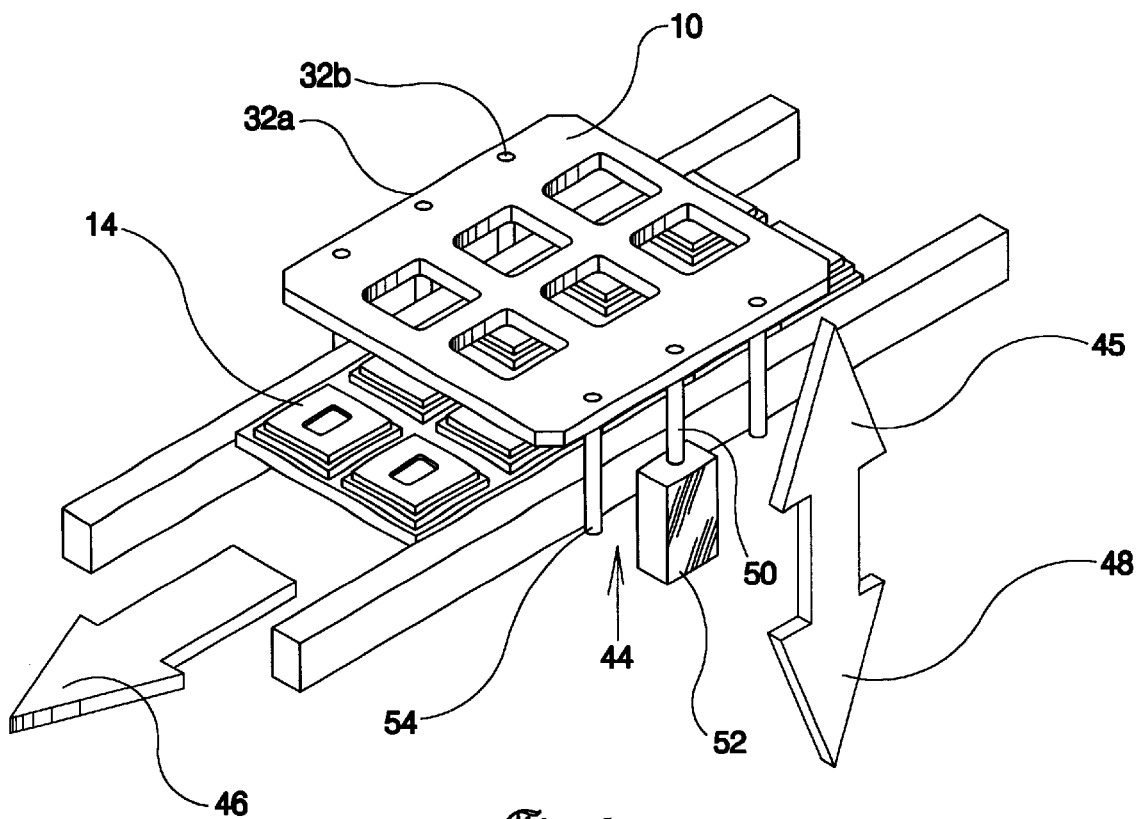
FIG. 4 is a perspective view of the mask plate in the raised position.
Figure 5:
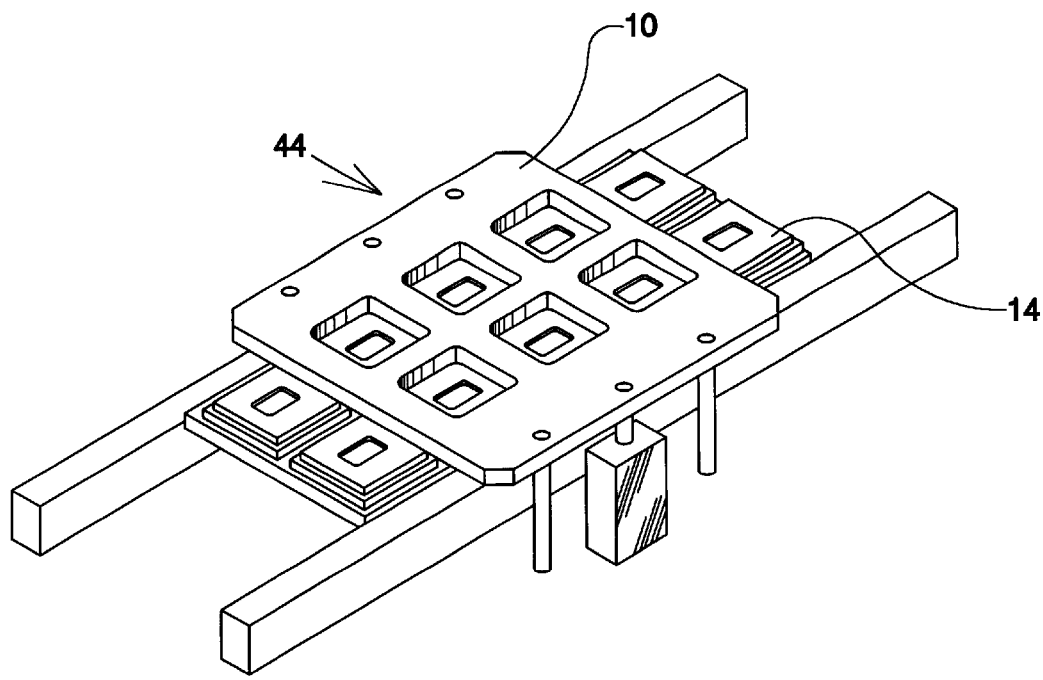
FIG. 5 is a perspective view of the mask plate in the lowered position.

As discussed above, the plate 10 is disposed in the cutting chamber 18. In one preferred embodiment, as shown in FIGS. 4 and 5 the plate 10 is engaged with a lift system 44. The lift system 44 moves the plate 10 up as indicated by the arrow 45 to a raised position shown in FIG. 4, wherein the plate 10 is distanced from the tray 14 such that the tray 14 can be moved beneath the plate as indicated by the arrow 46. The lift system 44 also moves the plate 10 downwardly as indicated by the arrow 48 to a lowered position shown in FIG. 5, wherein the plate 10 contacts the tray 14 to flatten the tray 14.

A preferred non-limiting lift system 44 can include opposed pistons 50 that reciprocate inside respective pneumatic cylinders 52 (only one piston-and-cylinder shown in FIGS. 4 and 5). The pistons 50 can be engaged with the plate 10 by respective fasteners that extend through intermediate lift system holes 32a in the plate 10. Also, if desired cylindrical rod guides 54 can slide within respective lateral lift system holes 32b in the plate 10 to guide the plate 10 as it moves up and down. If desired, the entire lift system 44 can be engaged with the conveyor such that in a less preferred embodiment the plate 10 need not remain disposed inside the cutting chamber, but rather can move along the conveyor with a tray 14.

In any case, the weight of the plate 10 and the force of the piston-and-cylinder lift system 44 when the plate 10 is in the lowered position press the plate 10 against the tray 14. This flattens the tray 14 in case any warping and/or bending or other deformation of the tray 14 might have occurred, thereby facilitating precise cutting of components on the semiconductor devices 16.

While the particular TRAY MASK PLATE FOR LASER-TRIMMING APPARATUS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A device for promoting precise laser cuts in a laser trimming apparatus including a conveyor system moving trays into and out of a laser cutting chamber, each tray holding plural semiconductor devices, the device comprising:

a rigid hard plate formed with at least one opening through which laser light can be directed; and a lift system engaged with the plate for moving the plate between a raised position, wherein the plate is distanced from a tray such that the tray can be moved beneath the plate, and a lowered position, wherein the plate contacts the tray to flatten the tray.

2. The device of claim 1, wherein the plate is formed with a chamfer for aligning the plate with the tray.

3. The device of claim 2, wherein the plate defines at least one bottom edge facing a tray when the plate is engaged with the lift system, and the chamfer is formed on the bottom edge.

4. The device of claim 3, wherein the bottom edge includes two chamfers and a distance is defined between the chamfers, the distance being marginally larger than a length of an edge of the tray.

5. The device of claim 1, wherein the plate is made of steel.

6. The device of claim 1, further comprising the laser trimming apparatus and at least one tray.

7. The device of claim 6, wherein the plate is disposed in the laser cutting chamber.

8. The device of claim 1, wherein the lift system includes at least one piston engaged with the plate.

9. A method for undertaking a laser cut of at least one semiconductor device, comprising:

disposing the semiconductor device on a tray;

conveying the tray into a cutting chamber of a laser trimming apparatus;

lowering a plate onto the tray, the plate defining at least one opening;

directing a laser through the opening onto the semiconductor device; and conveying the tray out of the cutting chamber.

10. The method of claim 9, further comprising forming at least one chamfer on the plate.

11. The method of claim 10, wherein the chamfer facilitates alignment of the tray and plate.

12. An assembly for laser trimming, comprising:

at least one tray configured to hold at least one semiconductor device;

at least one laser cutting chamber;

at least one conveyor system for conveying the tray into and out of the cutting chamber; and at least one lift system for selectively pressing a plate against the tray to facilitate precise cutting.

13. The assembly of claim 12, wherein the lift system includes the plate, the plate being made of a rigid hard material.

14. The assembly of claim 13, wherein the plate is made of steel.

15. The assembly of claim 13, wherein the plate includes at least one opening to allow laser light to pass therethrough.

16. The assembly of claim 15 wherein the tray defines an edge length, and the plate defines at least one bottom edge formed with opposed chamfers distanced from each other by a distance approximately equal to the edge length of the tray to facilitate proper engagement of the plate with the tray.

17. The assembly of claim 12, wherein the lift system is disposed in the cutting chamber.

* * * * *